United States Patent
Na

(10) Patent No.: US 7,253,489 B2
(45) Date of Patent: Aug. 7, 2007

(54) MAGNETIC FIELD SENSING DEVICE AND A FABRICATING METHOD OF THE SAME

(75) Inventor: Kyung-won Na, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 9 days.

(21) Appl. No.: 11/252,737

(22) Filed: Oct. 19, 2005

(65) Prior Publication Data

US 2006/0164757 A1    Jul. 27, 2006

(30) Foreign Application Priority Data

Jan. 25, 2005    (KR) ............ 10-2005-0006772

(51) Int. Cl.
*H01L 29/82* (2006.01)

(52) U.S. Cl. ..................... 257/421; 257/428

(58) Field of Classification Search ............ 257/421, 257/422, 423, 424, 425, 426, 427
See application file for complete search history.

(56) References Cited

U.S. PATENT DOCUMENTS

| | | | |
|---|---|---|---|
| 5,070,317 A * | 12/1991 | Bhagat ............ 336/200 |
| 6,030,877 A * | 2/2000 | Lee et al. ............ 438/381 |
| 6,166,422 A * | 12/2000 | Qian et al. ............ 257/531 |
| 6,411,086 B1 * | 6/2002 | Choi et al. ............ 324/253 |
| 6,414,554 B1 * | 7/2002 | Tilley et al. ............ 331/14 |
| 6,429,651 B1 * | 8/2002 | Choi et al. ............ 324/249 |
| 7,041,526 B2 * | 5/2006 | Shim et al. ............ 438/48 |

* cited by examiner

*Primary Examiner*—Roy Potter
(74) *Attorney, Agent, or Firm*—Sughrue Mion, PLLC

(57) ABSTRACT

A magnetic field sensing device and a fabrication method of the same featuring an easy planarization process for a substrate and a simplified procedure by the benefit of a slim planarizing substance. The magnetic field sensing device includes a substrate with a well of a predetermined depth and a plurality of grooves being formed thereon and a magnetic substance formed on an inner surface of the well to be located on an upper portion of the grooves. A first coil is formed in the grooves, a second coil is formed on an upper portion of the magnetic substance and is electrically connected to the first coil and insulating films are interposed between the first and the second coil and the magnetic substance for insulating the first and the second coil from the magnetic substance.

7 Claims, 8 Drawing Sheets

MAGNETIC FIELD SENSING DEVICE AND A FABRICATING METHOD OF THE SAME

CROSS-REFERENCE TO RELATED APPLICATIONS

This application claims benefit under 35 U.S.C. § 119 from Korean Patent Application No. 2005-06772, filed on Jan. 25, 2005, the entire content of which is incorporated herein by reference.

BACKGROUND OF THE INVENTION

1. Field of the Invention

The present invention relates to a micro magnetic field sensing device and a fabrication method of the same.

2. Description of the Related Art

A magnetic sensor composed of a magnetic substance and coils is highly sensitive to very small applied magnetic fields. In general, a magnetic sensor is fabricated by winding coils around a soft magnetic core, and requires an electronic circuit for generating a magnetic field proportional to a magnetic field measurement. A magnetic field sensing device for the magnetic sensor can be realized by a thin-film soft magnetic core and planar thin film coils.

FIGS. 1A to 1H are diagrams for explaining a related art magnetic field sensing element integrated with a substrate, and a fabrication method of the same. Referring to the drawings, the structure of the magnetic field sensing device and its fabrication method will now be described.

As shown in FIG. 1H, the magnetic field sensing device includes a substrate 1, a magnetic substance 2, a first and a second insulating film 3 and 4, and a first and a second coil 5, 6 formed of a plurality of wires for encompassing the magnetic substance 2. Here, the first coil 5 is disposed at the lower portion of the magnetic substance, whereas the second coil 6 is disposed at the upper portion of the magnetic substance. These first and second coils 5 and 6 are connected through holes 9 and 9' (please refer to FIG. 1F), for example, from both sides.

The fabrication procedure of the conventional magnetic field sensing device is largely divided into four steps: (1) preparing a substrate 1; (2) forming a first coil 5; (3) forming a magnetic substance 2; and (4) forming a second coil 6. More details on each step will now be provided.

First, as shown in FIG. 1A, a photoresist (layer) is applied to the prepared substrate 1 by a predetermined thickness, and first plating frames 7 have a plurality of grooves 7a formed through an exposing and a developing process. Then, by using an electroplating method, the grooves 7a of the plating frames 7 are filled with metals to form wires, and the plating frames 7 are removed. Here, before coating the substrate 1 with the photoresist, a seed film for plating is formed on the upper surface of the substrate 1. As a result, as shown in FIG. 1B, the first coil 5 is formed on the substrate 1.

Next, as shown in FIG. 1C, the first insulating film 3 is formed on the substrate 1 having the first coil 5 formed thereon. And, a soft magnetic film is layered on the first insulating film 3, and the magnetic substance 2 is formed, as shown in FIG. 1D, through the patterning and etching processes.

Later, the second insulating film 4 is formed on the magnetic substance 2 (please refer to FIG. 1E), and second plating frames 8 for forming the second coil 6 are formed on the second insulating film 4 as shown in FIGS. 1F and 1G. In detail, the through-holes 9 and 9' communicate with both ends of the first coil and are formed on the second insulating film 4, and a seed layer (not shown) is formed thereon. Then, a photoresist (layer) is applied, and the second plating frames 8 are formed on the second insulating film 4, as shown in FIG. 1F, through the exposing and developing processes.

Once the second plating frames 8 are formed, metals are injected to the grooves 8a of the second plating frames 8 using the electroplating process, thereby forming a plurality of wires. Finally, the plating frames 8 are removed and the second coil 6 is formed.

A thusly fabricated magnetic field sensing device is illustrated in FIG. 1H.

Among others, the thickness of a layer formed during each fabrication process helps determine the small size of the magnetic field sensing device and the difficulty of the fabrication process. Also, it has a great impact on the degree of planarization of a substrate in every process, difficulty of the fabrication process, defective proportion, and performance of the magnetic field sensing device. However, in case of the conventional magnetic field sensing device, since the first coil 5 is protruded over the substrate 1, the insulating films 3 and 4 for use in insulation and planarization get thicker. This consequently puts impediments in the way of fabricating small-sized magnetic field sensing devices. Especially, since the magnetic substance 2 has a fixed thickness, a stepped portion should occur on the second insulating film 4. To prevent the stepped portion, manufacturers make the insulating films 3 and 4 even thicker.

However, if the thickness of the insulating films 3 and 4 is increased, not only the entire thickness of the device is also increased, but also the process (i.e., etching) for forming the through holes 9 and 9' connecting the first coil 5 and the second coil 6 becomes very difficult, often resulting in a high inferiority rate.

Also, no matter how thick the second insulating film 4 may be coated, the upper surface of the second insulating film 4 cannot be planarized perfectly. The stepped portion causes a non-uniform distribution of exposure over the photoresist being deposited on the upper surface of the second insulating film 4. Ultimately, this increases the proportion of the second coil 6 that is defective.

SUMMARY OF THE INVENTION

It is, therefore, an object of the present invention to provide a magnetic field sensing device and a fabrication method of the same, for facilitating the planarization of a substrate in every fabrication process.

It is another object of the present invention to provide a magnetic field sensing device and a fabrication method of the same, which features an easy formation of a contact hole and a reduced inferiority rate in the formation of the contact hole by reducing the thickness of an insulating film.

It is still another object of the present invention to provide a magnetic field sensing device and a fabrication method of the same, for reducing a stepped portion of a second insulating film and thereby, facilitating the formation of a second coil.

It is still another object of the present invention to provide a small-size magnetic field sensing device and a fabrication method of the same.

It is yet another object of the present invention to provide a magnetic field sensing device and a fabrication method of the same, for increasing the thickness of a magnetic substance and thereby, facilitating the fabrication process.

To achieve the above objects and advantages, there is provided a magnetic field sensing device, including: a substrate with at least one well of a predetermined depth and a plurality of grooves being formed thereon; a magnetic substance formed on an inner surface of the well to be located on an upper portion of the grooves; a first coil formed in the grooves; a second coil formed on an upper portion of the magnetic substance and being electrically connected to the first coil; and insulating films interposed between the first and the second coil for insulating the first and the second coil from the magnetic substance.

In one exemplary embodiment of the invention, the insulating films includes: a first insulating film for insulating the first coil from the magnetic substance; and a second insulating film for insulating the second coil from the magnetic substance. Also, the first coil and the second coil are electrically connected to each other through contact holes which are formed by penetrating the first and second insulating film formed on an outer surface of the well. The magnetic substance is formed in such a manner that an upper surface of the magnetic substance is on a level with the first insulating film formed on the outer surface of the well. Meanwhile, the magnetic substance is an amorphous material.

In one exemplary embodiment of the invention, a first and a second seed film for plating the first and the second coil are interposed between the first coil and the substrate and between the second coil and the second insulating film, respectively. Moreover, a silicon oxide film is interposed between the first seed film and the substrate.

Another aspect of the invention provides a fabrication method of a magnetic field sensing device, which the method includes the steps of: (a) preparing a substrate; (b) forming at least one well on the substrate; (c) forming a plurality of grooves on the substrate with the well being formed thereon; (d) forming a first coil in the plurality of grooves; (e) forming a first insulating film on an upper portion of the substrate on which the first coil is formed; (f) forming a magnetic substance on an upper portion of the first insulating film; (g) forming a second insulating film on an upper portion of the first insulating film and an upper portion of the magnetic substance, respectively; and (h) forming a second coil on an upper portion of the second insulating film to be in correspondence to the first coil.

In the step (c), the plurality of grooves are formed on the inner and outer surfaces of the well, and the step (d) for forming the first coil comprises sub-steps of: (d-1) forming a first seed layer on the upper portion of the substrate including the plurality of grooves; (d-2) electroplating a substance for use in the first coil onto the first seed film; and (d-3) removing the first seed film. Also, before forming the first seed film, a silicon oxide film may be formed on the substrate. Copper may be used in the first coil.

In the step (f), the magnetic substance is formed on the inner surface of the well, and the upper surface of the magnetic substance is a level with the first insulating film formed on the outer surface of the well. Preferably, the first insulating film is made of an adhesive material so that the magnetic substance is adhered onto the first insulating film. Also, the step (h) for forming the second coil includes sub-steps of: (h-1) etching the first and second insulating films formed on the outer surface of the well and thereby, forming contact holes; (h-2) forming a second seed film on the second insulating film in which the contact holes is formed; (h-3) forming a plating frame for use in the second coil on the second seed film; (h-4) filling the plating frame for use in the second coil with a substance for use in the second coil and thereby, forming a plurality of wires; and (h-5) removing the second seed film and the plating frame for use in the second coil. In the step (h-4), the plurality of wires may be formed by electroplating, and during the electroplating process in the step (h-4) the first coil and the second coil may be electrically connected to each other through the contact holes.

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF THE PREFERRED EMBODIMENTS

An exemplary embodiment of the present invention will be described herein below with reference to the accompanying drawings.

FIGS. 2A to 2I are cross-sectional views of a magnetic field sensing device and a fabrication method of the same, according to an exemplary embodiment of the present invention, and FIGS. 3A to 3I are cross-sectional views of FIGS. 2A to 2I, respectively.

Figure 1A:
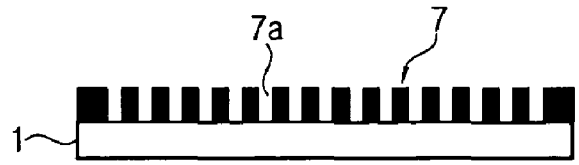
FIGS. 1A to 1H are cross-sectional views of a magnetic field sensing device and a fabrication method of the same, according to a related art.
Figure 1B:
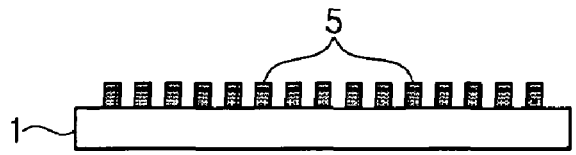
Figure 1C:
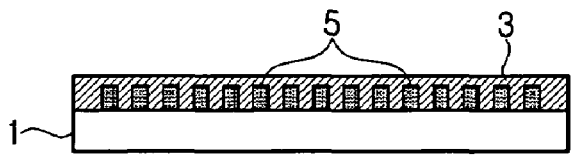
Figure 1D:
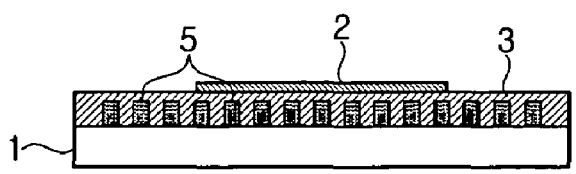
Figure 1E:
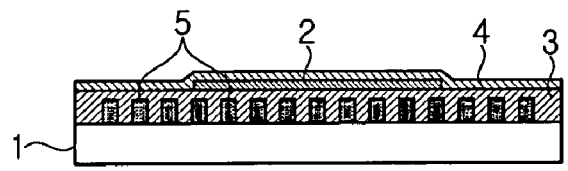
Figure 1F:
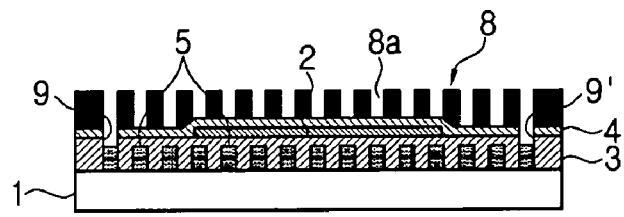
Figure 1G:
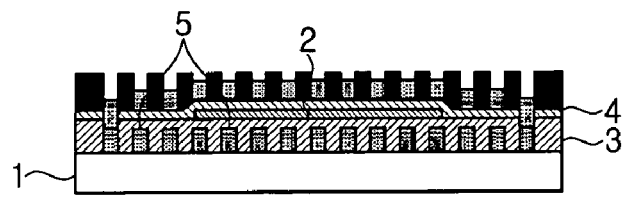
Figure 1H:
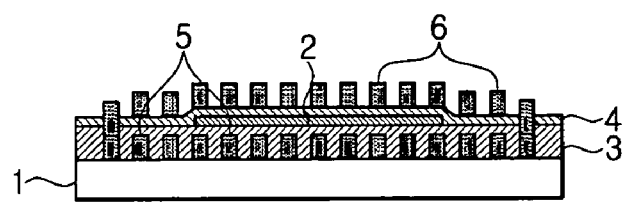
Figure 2A:
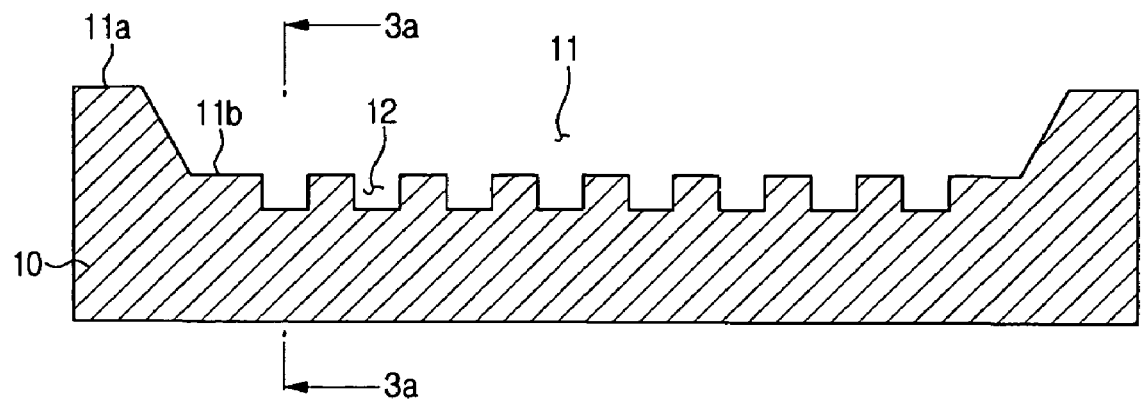
FIGS. 2A to 2I are cross-sectional views of a magnetic field sensing device and a fabrication method of the same, according to an exemplary embodiment of the present invention.
Figure 2B:
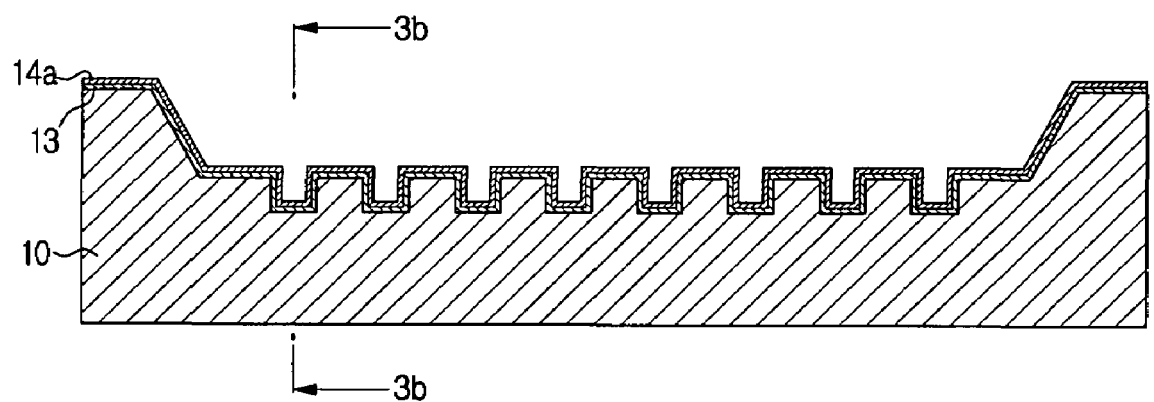
Figure 2C:
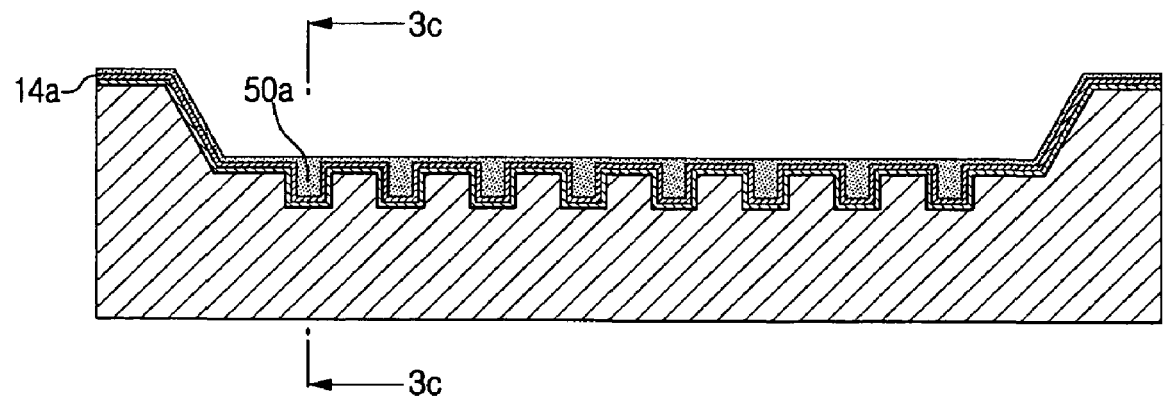
Figure 2D:
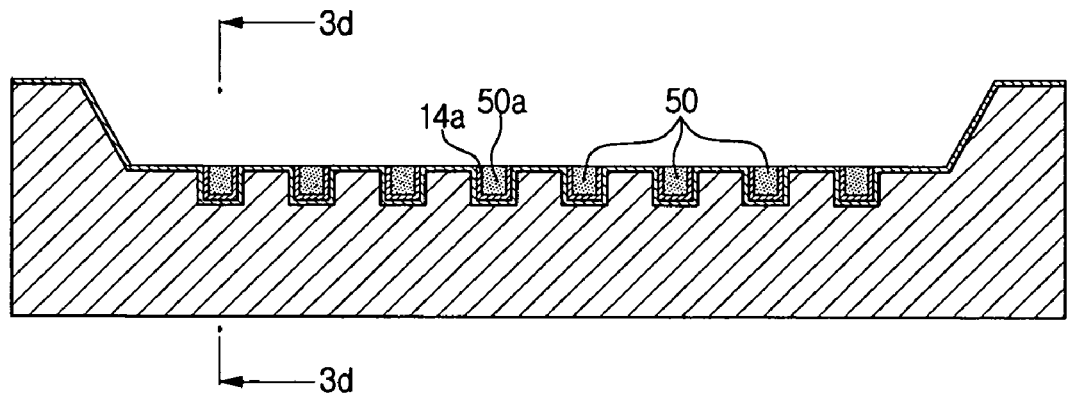
Figure 2E:
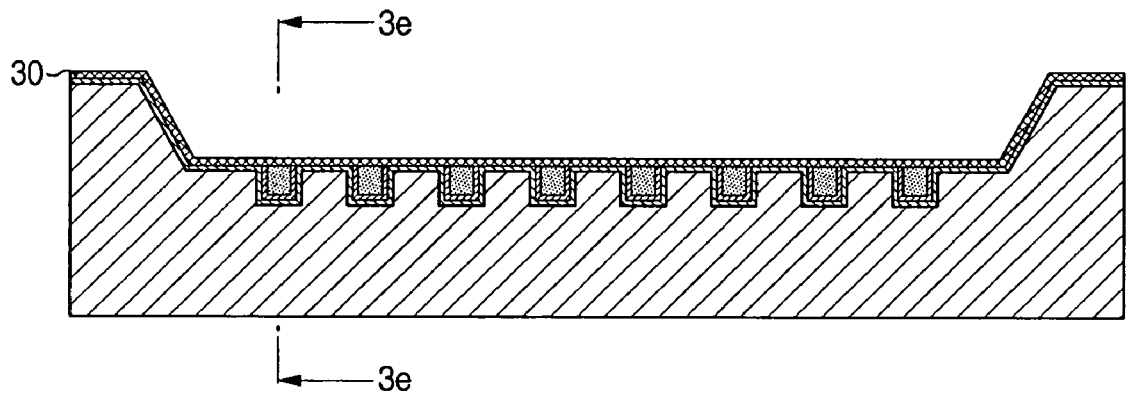
Figure 2F:
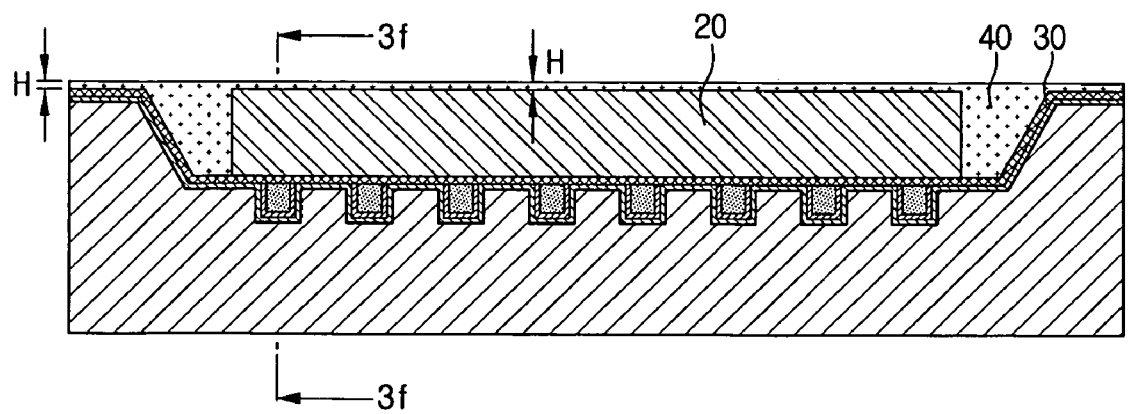
Figure 2G:
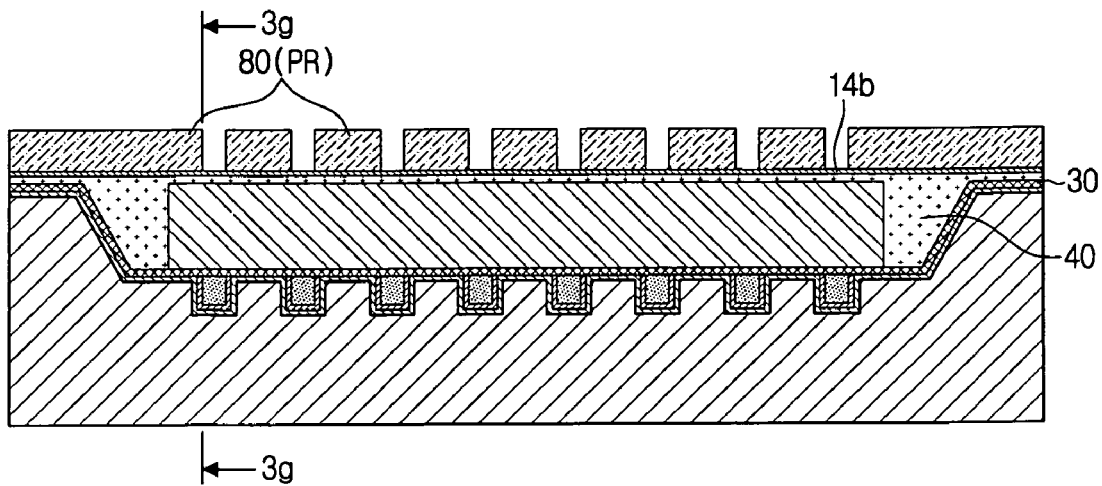
Figure 2H:
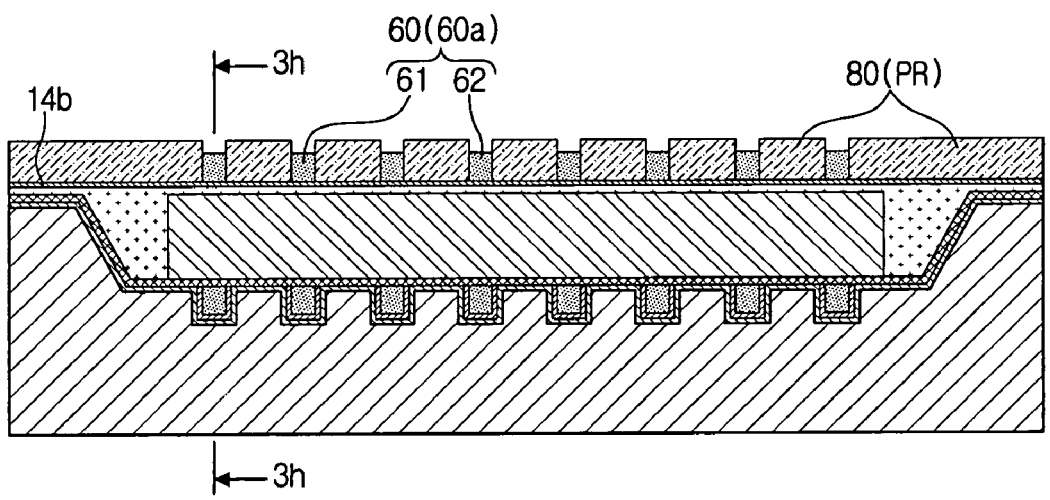
Figure 2I:
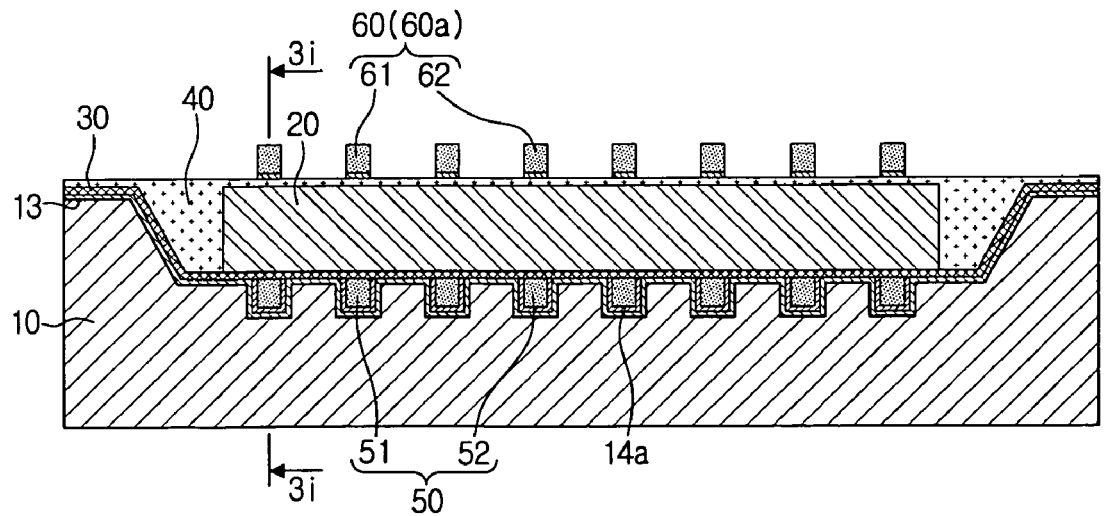
Figure 3A:
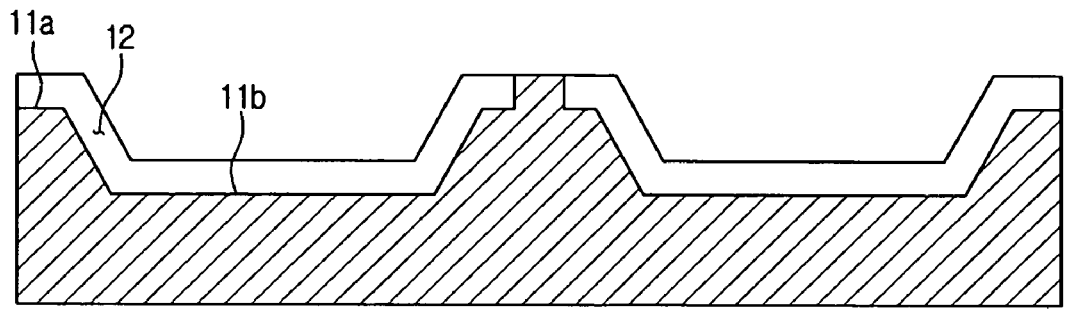
FIGS. 3A to 3I are cross-sectional views taken along lines 3a—3a to 3i—3i in FIGS. 2A to 2I, respectively.
Figure 3B:
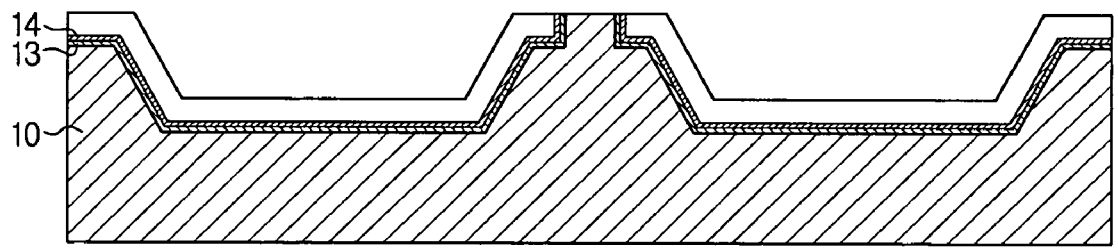
Figure 3C:
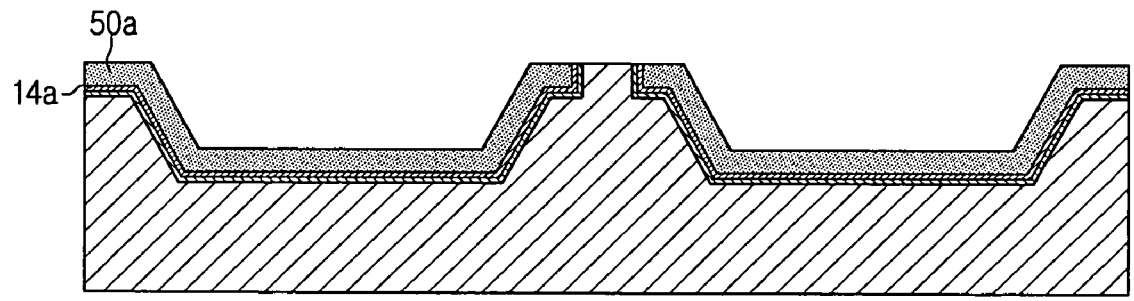
Figure 3D:
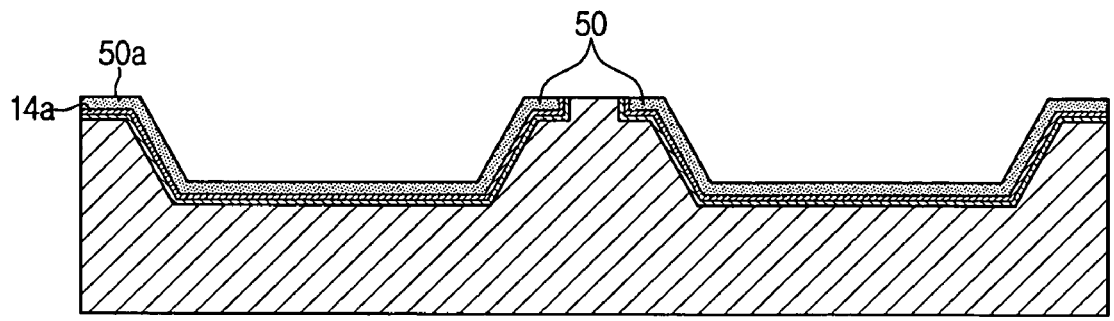
Figure 3E:
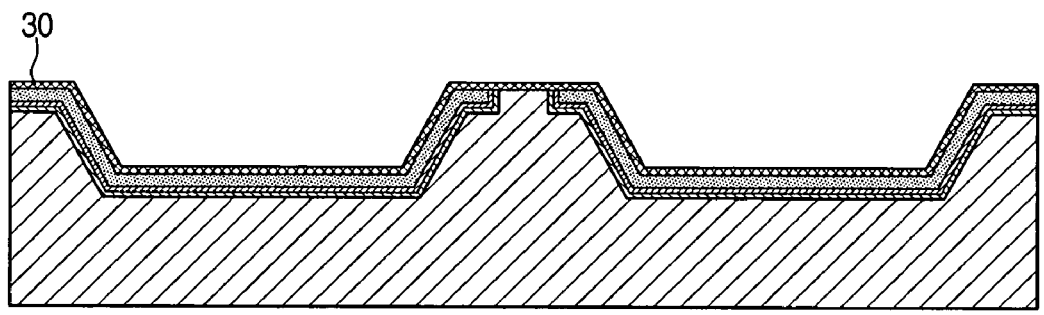
Figure 3F:
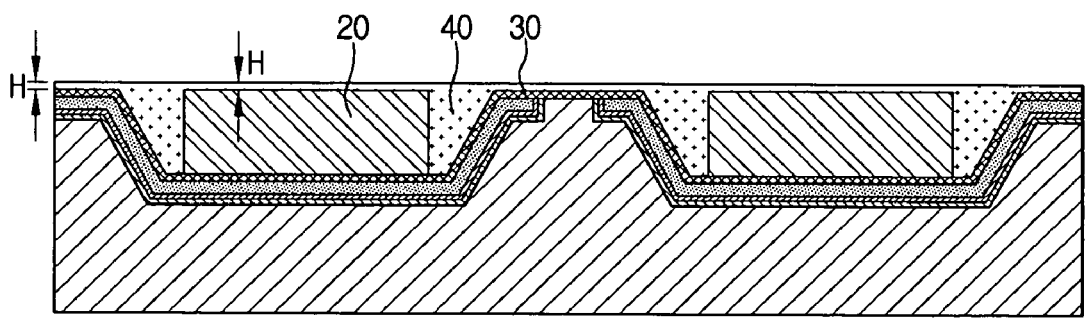
Figure 3G:
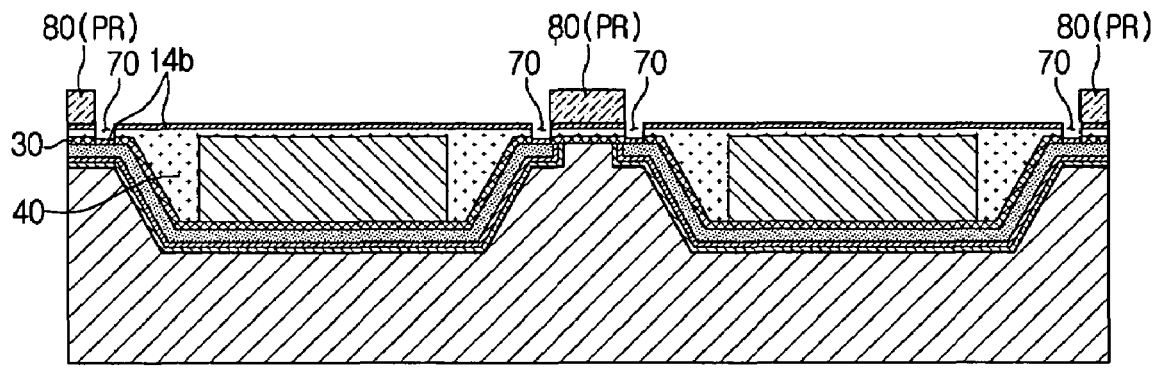
Figure 3H:
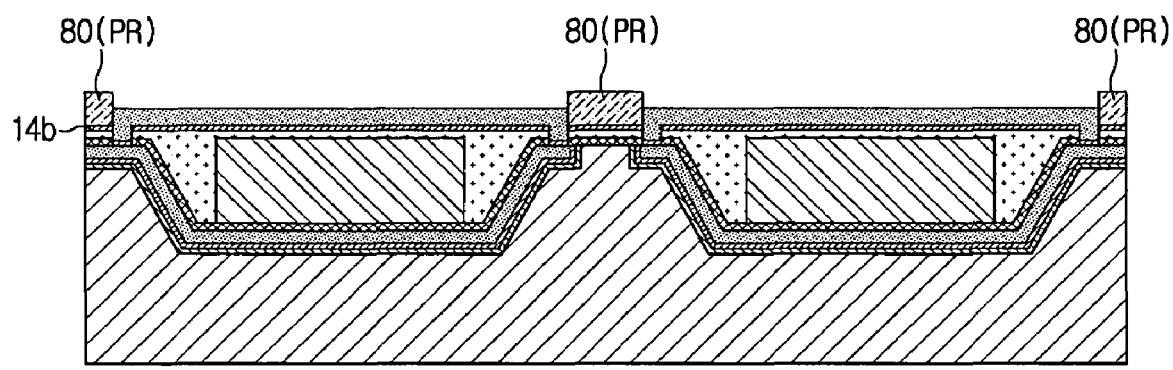
Figure 3I:
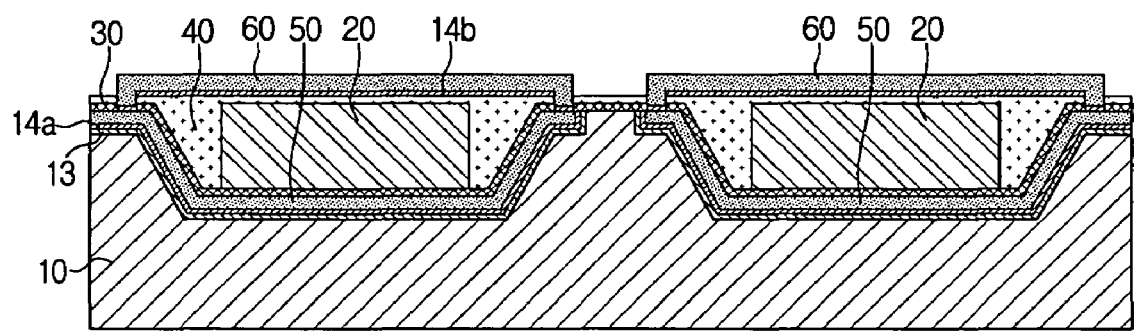

As shown in FIG. 2I and FIG. 3I, the magnetic field sensing device of an exemplary embodiment of the invention includes a substrate 10, a magnetic substance 20 formed on the substrate 10, a plurality of wires (51, 52 . . . ) (61, 62 . . . ) (hereinafter, called collectively 51, 61), a first and a second coil 50, 60 provided to the lower and the upper portion of the magnetic substance 20, respectively, and a first and a second insulating film 30, 40 interposed between the first and second coils 50 and 60 and the magnetic substance 20 for insulating the magnetic substance 20 from the first and second coils 50 and 60.

In particular, the substrate 10 of the invention includes a rectangular shaped well 11 being depressed at a predetermined depth from the surface, and, and a plurality of grooves 12 for use in the first coil 50 are formed in a stripe pattern over an inner surface 11b and an outer surface 1a of the well 11 (please refer to FIG. 2A and FIG. 3A). The rectangular shaped well 11 is formed in such a manner that its side wall is gradually inclined in an inward direction from the top to the bottom surface, and this inclined side wall can be formed by a conventional etching technique. And, a silicon oxide film 13 is formed on the surface of the substrate 10 where the well 11 and the grooves 12 for use in the first coil are also formed. Since the substrate 10 is not a perfect insulator, it is necessary to make sure that the substrate 10 is completely insulated from the first coil 50 through the silicon oxide film 13. However, depending on the material of the substrate 10, the silicon oxide 13 can be used optionally.

The magnetic substance 20 is formed on the inner surface 11b of the well 11 (please refer to FIGS. 2F and 3F) in such a manner that its upper surface is not protruded from the upper surface of the first insulating film 30 coated on the outer surface 11a of the well 11 (please refer to FIGS. 2F and 3F). The upper surface of the magnetic substance 20 may be on a level with the upper surface of the first insulating film 30 on the outer surface 11a of the well 11. In doing so, planarization of the second insulating film 40 becomes easier. Also, the magnetic substance 20 may be made of amorphous materials having low coercive force and thereby, be capable of sensing a very small magnetic field of the outside.

The first coil 50 is formed in the grooves 12 by an electroplating method, for example, and a first seed film 14a for electroplating is formed between the first coil 50 and the groove 12. In general, the first coil 50 is made of conductive metals such as copper (Cu).

The second coil 60 is electrically connected to the first coil 50 through contact holes 70 (please refer to FIG. 3G). The contact holes 70 are formed by etching (or penetrating) the first and second insulating films 30 and 40 coated on the outer surface 11a of the well 11.

The first insulating film 30 is coated on the entire part of one surface of the substrate 10 that includes not only the inner surface 11b but also the outer surface 11a of the well 11 (please refer to FIGS. 2E and 3E). More specifically, the first insulating film 30 is interposed between the lower surface of the magnetic substance 20 and the first coil 50 to insulate the magnetic substance 20 from the first coil 50.

The second insulating film 40 is coated on the upper surface of the magnetic substance 20 and the upper surface of the first insulating film 30. More specifically, the second insulating film 40 is interposed between the upper surface of the magnetic substance 20 and the second coil 60 to insulate the magnetic substance 20 from the second coil 60.

As described above, the first insulating film 30 can be made thin, unlike the related art, because the first coil 50 is formed in the grooves 12 on the substrate 10. Also, by forming the magnetic substance 20 on the inner surface 11b of the well 11 and making the upper surface of the magnetic substance 20 and the first insulating film 30 formed on the outer surface 11a of the well 11 be on the same level (plane), a thick magnetic substance 20 can be formed and at the same time, planarization of the second insulating film 40 becomes easier. Now that the second insulating film 40 is planarized more easily, the second insulating film 40 can also be made thinner, and the exposing process of the photoresist for forming a plating frame 80 (please refer to FIGS. 2G and 3G) of the second coil 60 becomes easier. Further, the reduced thickness of the first insulating film 30 and the second insulating film 40 enables to fabricate a slim magnetic field sensing device, and form the contact holes 70 (please refer to FIG. 3G).

The following will now explain the fabrication method of the magnetic field sensing device according to an exemplary embodiment of the present invention.

Referring to FIGS. 2A and 3A, the well 11 and the grooves 12 for use in the first coil 50 are formed on one surface of the substrate 10 through any known etching method. Especially, the well 11 is etched in such a manner to have inclined sides in a rectangular shape. Meanwhile, the grooves 12 for use in the first coil 50 are etched in a stripe pattern to correspond to the wires 51 of the first coil 50 in number.

Referring to FIGS. 2B and 3B, the silicon oxide film 13 and the first seed film 14a are formed on the same side of the substrate where the well 11 and the grooves for use in the first coil 12 are formed. The silicon oxide film 13 is formed through a well-known oxidation process, and the first seed film 14a is formed on the upper surface thereof. The first seed layer 14a is used for plating the first coil 50 (please refer to FIGS. 2I and 3I), and similar to the silicon oxide film 13, it is coated on the entire portion of one surface of the substrate through the deposition process. Optionally, however, the first seed film 14a can be patterned only on the grooves 12 for use in the first coil (please refer to FIGS. 2A and 3A).

Referring to FIGS. 2C and 3C, a substance 50a for use in the first coil is formed on the upper surface of the first seed film 14a through the electroplating method. A frequently used example for the substance 50a for use in the first coil is a metal like copper. The substance 50a for use in the first coil is plated on the entire portion of the first seed layer 14a. At this time, the grooves 12 for use in the first coil are completely filled with the substance 50a for use in the first coil. However, if the first seed film 14a is coated only on the grooves 12 for use in the first coil, the substance 50a for use in the first coil can be plated only on the grooves 12 for use in the first coil (please refer to FIGS. 2C and 3C).

Referring to FIGS. 2D and 3D, the first seed layer 14a and the substance 50a for use in the first coil are etched. In this manner, the first seed layer 14a and the substance 50a for use in the first coil are formed only on the grooves 12 for use in the first coil (please refer to FIGS. 2A and 3A), and the first coil 50 composed of a plurality of wires 51 (please refer to FIGS. 2I and 3I) is finally formed.

Referring to FIGS. 2E and 3E, the first insulating film 30 is deposited on the entire portion of one surface of the substrate 10. Since the inner surface 11b of the well 11 where the magnetic substance 20 (please refer to FIGS. 2F and 3F) is supposed to be formed is planarized, the first insulating film 30 can be formed thinly.

Referring to FIGS. 2F and 3F, the magnetic substance 20 is formed on the inner surface 11b of the well 11 (please refer to FIGS. 2A and 3A). The magnetic substance 20 is prepared by sintering in advance, and adhered onto the upper surface of the first insulating film 30 made of an adhesive material. Then, the second insulating film 40 is coated on the upper surface of the magnetic substance 20. Preferably, the magnetic substance 20 has the same height as the first insulating film 30 formed on the outer surface 11a of the well 11 (please refer to FIGS. 2A and 3A). In other words, the magnetic substance 20 is on a level with the upper surface of the first insulating film 30 formed on the outer surface 11a of the well 11.

Meanwhile, the thickness of the magnetic substance 20 can be increased by forming the first coil 50 in the grooves 12 for use in the first coil (please refer to FIGS. 2A and 3A) and placing the magnetic substance 20 at the inner surface 11b of the well 11 (please refer to FIGS. 2A and 3A). In this manner, the process(es) typically performed for reducing the thickness of the magnetic substance 20 is no longer required, and the fabrication process of the magnetic substance 20 becomes much easier.

Furthermore, planarization of the second insulating film 40 being coated on the upper portion of the magnetic substance 20 becomes easier. As such, the thickness H of the second insulating film 40 coated on the upper portion of the magnetic substance 20 can be formed thinly. At this time, the thickness H of the second insulating film 40 is equivalent to the thickness H thereof formed on the outer surface 11a of the well (please refer to FIGS. 2A and 3A). Therefore, it is possible to reduce the thickness H of the second insulating film 40 on the outer surface 11a of the well 11 (please refer to FIGS. 2A and 3A) where the contact holes 70 are formed. In this manner, it is possible to fabricate a very slim magnetic field sensing device.

Referring to FIGS. 2G and 3G, once the second insulating film 40 is formed, the contact holes 70 are etched to electrically connect the first coil 50 and the second coil 60. The contact holes 70 are formed by penetrating the first and the second insulating films 30 and 40 formed on the outer surface 11a of the well 11 (please refer to FIGS. 2A and 3A). By making the first and second insulating films 30 and 40 thinly, it becomes easier to form the contact holes 70 therein and thus, inferiority generated during the formation of the contact holes 70 can be reduced. Then, the second seed film 14b is coated on the upper surface of the contact holes 70 and the second insulating film 40. After coating the photoresist PR, a plating frame 80 for use in the second coil is formed by exposing and developing, as shown in FIGS. 2G and 3G. Since the second insulating film 40 is sufficiently planarized and does not have the step difference, the exposure process is very efficiently performed. This in return enables one to form the plating frame 80 for use in the second coil with higher precision.

Referring next to FIGS. 2H and 3H, a substance 60a for use in the second coil is filled in the plating frame 80 for use in the second coil by electroplating to form a plurality of wires 61. In this manner, the second coil 60 is formed. Now that the contact holes 70 are filled with the substance 60a for use in the second coil, the second coil and the first coil are electrically connected to each other.

Referring lastly to FIGS. 2I and 3I, the magnetic field sensing device is fabricated by removing the photoresist PR and the second seed film 14b through etching. If desired, for the purpose of protection, a protective film can be formed on the upper portion of the substrate 10 with the second coil 60 being formed thereon.

As explained so far, by forming the first coil at the grooves of the substrate and forming the magnetic substance at the inner surface of the well, it becomes easier to planarize the second insulating film and form the second coil thereon.

Also, according to an exemplary embodiment of the present invention, by reducing the thickness of the first and second insulating films, it becomes easier to form the contact holes therein, and inferiority rate in the processing for the contact hole caused by the stepped portion on the second insulating film can be reduced markedly.

Since the first coil is directly plated in the grooves, the complicated process performed in the traditional method, such as forming and removing the first plating frame using the photoresist, can now be much simplified.

Since the magnetic substance can be made thick, the process for slimming the magnetic substance in the traditional method is not required any more. This also simplifies the entire fabrication procedure.

Overall, by slimming the second insulating film and forming the first coil in the grooves, it becomes possible to fabricate a slim or small-sized magnetic field sensing device.

The foregoing embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A magnetic field sensing device, comprising:
    a substrate with at least one well of a predetermined depth and a plurality of grooves being formed thereon;
    a magnetic substance formed on an inner surface of the well to be located on an upper portion of the grooves;
    a first coil formed in the grooves;
    a second coil formed on an upper portion of the magnetic substance and being electrically connected to the first coil; and
    insulating films interposed between the first and the second coil and the magnetic substance for insulating the first and the second coil from the magnetic substance.

2. The device according to claim 1, wherein the insulating films comprises:
    a first insulating film for insulating the first coil from the magnetic substance; and
    a second insulating film for insulating the second coil from the magnetic substance.

3. The device according to claim 2, wherein the first coil and the second coil are electrically connected to each other through contact holes which are formed by penetrating the first and second insulating films formed on an outer surface of the well.

4. The device according to claim 2, wherein the magnetic substance is formed in such a manner that an upper surface of the magnetic substance is on a level with the first insulating film formed on the outer surface of the well.

5. The device according to claim 4, wherein the magnetic substance is an amorphous material.

6. The device according to claim 2, wherein a first and a second seed film for plating the first and the second coil are interposed between the first coil and the substrate and between the second coil and the second insulating film, respectively.

7. The device according to claim 2, wherein a silicon oxide film is interposed between the first seed film and the substrate.

* * * * *